United States Patent
Park et al.

(10) Patent No.: US 10,347,684 B2
(45) Date of Patent: Jul. 9, 2019

(54) IMAGE SENSOR

(71) Applicant: SAMSUNG ELECTRONICS CO., LTD., Suwon-si (KR)

(72) Inventors: Honglae Park, Seongnam-si (KR); Jaeho Kim, Seoul (KR); Hyoshin Ahn, Seoul (KR); Inkook Jang, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/848,733

(22) Filed: Dec. 20, 2017

(65) Prior Publication Data

US 2018/0182805 A1    Jun. 28, 2018

(30) Foreign Application Priority Data

Dec. 28, 2016 (KR) .................. 10-2016-0181325

(51) Int. Cl.
| | |
|---|---|
| *H01L 31/18* | (2006.01) |
| *H01L 27/146* | (2006.01) |
| *H01L 31/0248* | (2006.01) |
| *H04N 5/361* | (2011.01) |

(52) U.S. Cl.
CPC .... *H01L 27/14643* (2013.01); *H01L 31/0248* (2013.01); *H01L 31/18* (2013.01); *H04N 5/361* (2013.01)

(58) Field of Classification Search
CPC ........... H01L 27/14627; H01L 27/1463; H01L 27/1464; H01L 27/14621; H01L 27/14685; H01L 27/14605; H01L 27/14643; H01L 27/14629
See application file for complete search history.

(56) References Cited

U.S. PATENT DOCUMENTS

| | | | |
|---|---|---|---|
| 8,183,603 B2 | 5/2012 | Yamaguchi et al. |
| 8,338,901 B2 | 12/2012 | Ueno et al. |
| 8,405,016 B2 | 3/2013 | Oshiyama et al. |
| 8,450,728 B2 | 5/2013 | Yamaguchi |
| 8,669,634 B2 | 3/2014 | Kanbe et al. |
| 8,729,450 B2 | 5/2014 | Yoshitsugu |
| 9,105,547 B2 | 8/2015 | Ohgishi |
| 9,224,881 B2 | 12/2015 | Hsiung et al. |
| 9,337,226 B2 | 5/2016 | Manda et al. |
| 9,368,536 B2 | 6/2016 | Oshiyama et al. |
| 2007/0210395 A1 | 9/2007 | Maruyama et al. |
| 2011/0031376 A1 | 2/2011 | Oshiyama et al. |
| 2011/0156104 A1 | 6/2011 | Yamaguchi |
| 2011/0175187 A1 | 7/2011 | Ueno et al. |
| 2012/0228473 A1 | 9/2012 | Yoshitsugu |
| 2013/0109129 A1 | 5/2013 | Kanbe et al. |

(Continued)

*Primary Examiner* — Jaehwan Oh
(74) *Attorney, Agent, or Firm* — Sughrue Mion, PLLC

(57) ABSTRACT

An image sensor includes a substrate including a photoelectric conversion part therein, and a fixed charge layer provided above the substrate. The fixed charge layer includes a first metal oxide and a second metal oxide, which are different from each other. The first metal oxide includes a first metal, and the second metal oxide includes a second metal different from the first metal. Concentration of the first metal in the fixed charge layer progressively increases from an upper portion of the fixed charge layer to a lower portion of the fixed charge layer.

18 Claims, 9 Drawing Sheets

(56) References Cited

U.S. PATENT DOCUMENTS

| | | | |
|---|---|---|---|
| 2013/0221410 A1* | 8/2013 | Ahn | H01L 31/0232 257/225 |
| 2013/0270663 A1* | 10/2013 | Lin | H01L 27/14625 257/432 |
| 2013/0285130 A1 | 10/2013 | Ting et al. | |
| 2014/0264706 A1 | 9/2014 | Ohgishi | |
| 2014/0299956 A1 | 10/2014 | Hsiung et al. | |
| 2015/0091121 A1 | 4/2015 | Manda et al. | |
| 2015/0187835 A1 | 7/2015 | Kim et al. | |
| 2015/0214264 A1 | 7/2015 | Oshiyama et al. | |
| 2015/0243694 A1* | 8/2015 | Ihara | H01L 27/14605 257/443 |
| 2015/0373255 A1* | 12/2015 | Kim | H01L 27/14607 348/349 |
| 2017/0047363 A1* | 2/2017 | Choi | H01L 27/1463 |

* cited by examiner

IMAGE SENSOR

CROSS-REFERENCE TO THE RELATED APPLICATION

This application claims priority from Korean Patent Application No. 10-2016-0181325, filed on Dec. 28, 2016, in the Korean Intellectual Property Office, the disclosure of which is incorporated herein in its entirety by reference.

BACKGROUND

1. Field

Apparatuses consistent with exemplary embodiments of the inventive concepts relate to an image sensor and, more particularly, to an image sensor with improved reliability.

2. Description of the Related Art

Image sensors are semiconductor devices converting optical images into electrical signals. Image sensors may be categorized as any one of charge coupled device (CCD) image sensors and complementary metal-oxide-semiconductor (CMOS) image sensors (CIS). The CIS may include a plurality of pixels two-dimensionally arranged. Each of the pixels may include a photodiode (PD). The photodiode may convert incident light into an electrical signal.

SUMMARY

Exemplary embodiments of the inventive concept provide an image sensor capable of improving a dark current characteristic.

According to an exemplary embodiment, there is provided an image sensor which may include a substrate including a photoelectric conversion part therein, and a fixed charge layer provided above the substrate. The fixed charge layer may include a first metal oxide and a second metal oxide, which are different from each other. The first metal oxide may include a first metal, and the second metal oxide includes a second metal different from the first metal. Concentration of the first metal in the fixed charge layer may progressively increase from an upper portion of the fixed charge layer to a lower portion of the fixed charge layer.

According to an exemplary embodiment, there is provided an image sensor which may include a substrate including a photoelectric conversion part therein, and a fixed charge layer provided above the substrate. The fixed charge layer may include a metal oxide doped with impurities, and the impurities may accelerate generation of interstitial oxygen in the metal oxide.

According to an exemplary embodiment, there is provided an image sensor which may include a substrate comprising a photoelectric conversion part, and a fixed charge layer disposed above the substrate and comprising impurities to form negative charges. Here, the fixed charge layer may be configured such that concentration of the negative charges is greater in a lower portion of the fixed charge layer close to the substrate than in an upper portion of the fixed charge layer opposite to the lower portion.

BRIEF DESCRIPTION OF THE DRAWINGS

The exemplary embodiments of the inventive concept will become more apparent in view of the attached drawings and accompanying detailed description.

DETAILED DESCRIPTION OF THE EXEMPLARY EMBODIMENTS

Figure 1:
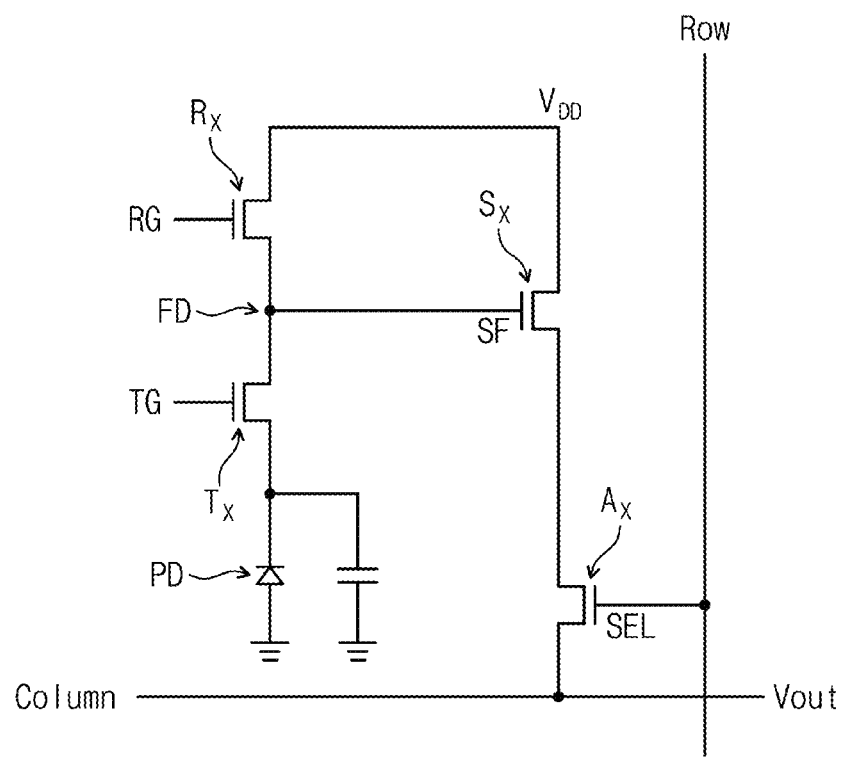
FIG. 1 is a circuit diagram illustrating an image sensor according to an exemplary embodiment of the inventive concept.

As the inventive concept allows for various changes and numerous exemplary embodiments, the exemplary embodiments will be illustrated in the drawings and described in detail in the written description. However, this is not intended to limit the inventive concept to particular modes of practice, and it is to be appreciated that all changes, equivalents, and substitutes that do not depart from the spirit and technical scope of the inventive concept are encompassed in the inventive concept. In the description of the exemplary embodiments, certain detailed explanations of the related art are omitted when it is deemed that they may unnecessarily obscure the essence of the inventive concept.

It will be understood that when an element or layer is referred to as being "over," "above," "on," "connected to" or "coupled to" another element or layer, it can be directly over, above, on, connected or coupled to the other element or layer or intervening elements or layers may be present. In contrast, when an element is referred to as being "directly over," "directly above," "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "over," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of the inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments of the inventive concept are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, the exemplary embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a circuit diagram illustrating an image sensor according to an exemplary embodiment of the inventive concept.

Referring to FIG. 1, an image sensor may include a photoelectric conversion region PD, a transfer transistor $T_x$, a source follower transistor $S_x$, a reset transistor $R_x$, and a selection transistor $A_x$. The transfer transistor $T_x$, the source follower transistor $S_x$, the reset transistor $R_x$, and the selection transistor $A_x$ may respectively include a transfer gate TG, a source follower gate SF, a reset gate RG, and a selection gate SEL. A photoelectric conversion part (not shown) may be provided in the photoelectric conversion region PD. In some exemplary embodiments, the photoelectric conversion part may be a photodiode including an N-type dopant region and a P-type dopant region. A drain of the transfer transistor $T_x$ may be a floating diffusion region FD. The floating diffusion region FD may also correspond to a source of the reset transistor $R_x$. The floating diffusion region FD may be electrically connected to the source follower gate SF of the source follower transistor $S_x$. The source follower transistor $S_x$, may be connected to the selection transistor $A_x$. The reset transistor $R_x$, the source follower transistor $S_x$, and the selection transistor $A_x$ may be shared by neighboring pixels, and thus an integration density of the image sensor may be improved.

A method of operating the image sensor will be described hereinafter with reference to FIG. 1. A power voltage $V_{DD}$ may be applied to a drain of the reset transistor $R_x$ and a drain of the source follower transistor $S_x$, in a state in which light is blocked, thereby discharging charges remaining in the floating diffusion region FD. Thereafter, the reset transistor $R_x$ may be turned-off, and external light may be incident on the photoelectric conversion region PD to generate electron-hole pairs in the photoelectric conversion region PD. Holes may move toward the P-type dopant region of the photoelectric conversion region PD to be accumulated therein, and electrons may move toward the N-type dopant region of the photoelectric conversion region PD. When the transfer transistor $T_x$ is turned-on, these charges may be transferred into and accumulated in the floating diffusion region FD. A gate bias of the source follower transistor $S_x$, may be changed in proportion to the amount of the charges accumulated in the floating diffusion region FD, thereby causing a change in potential of a source of the source follower transistor $S_x$. At this time, the selection transistor $A_x$ may be turned-on, and thus a signal generated by the charges may be sensed through a column line.

Figure 2:
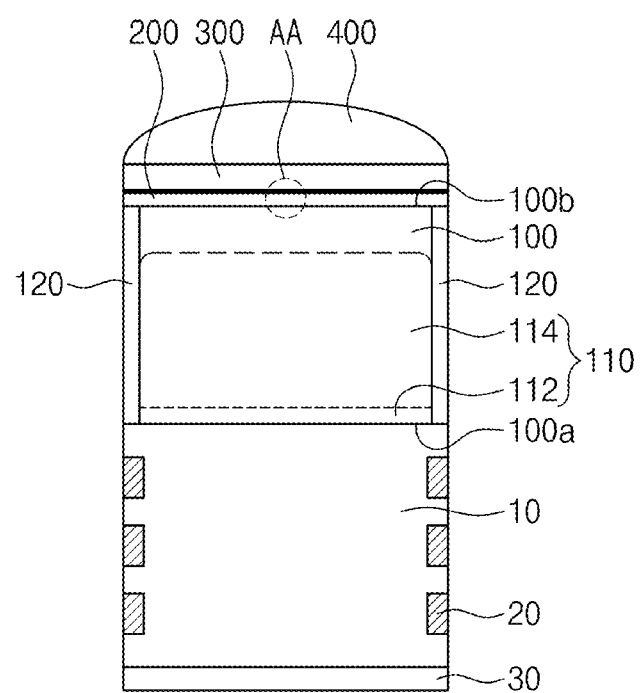
FIG. 2 is a cross-sectional view illustrating an image sensor according to an exemplary embodiment of the inventive concept.
Figure 3:
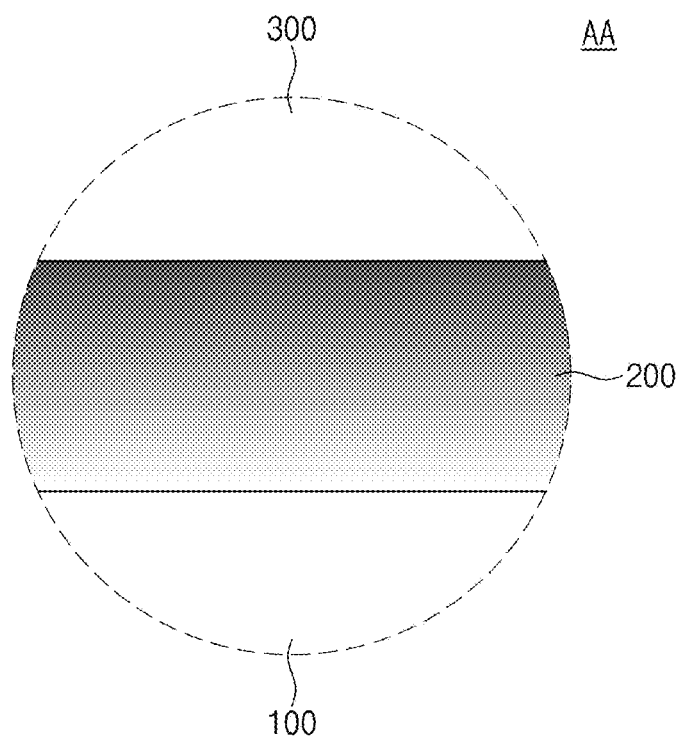
FIG. 3 is an enlarged view of a portion 'AA' of FIG. 2, according to an exemplary embodiment of the inventive concept.

FIG. 2 is a cross-sectional view illustrating an image sensor according to an exemplary embodiment of the inventive concept. FIG. 3 is an enlarged view of a portion 'AA' of FIG. 2.

Referring to FIGS. 2 and 3, a substrate 100 including a photoelectric conversion part 110 may be provided. The substrate 100 may be or include a silicon substrate, a silicon-on-insulator (SOI) substrate, or a semiconductor epitaxial layer. In some exemplary embodiments, the substrate 100 may have a first conductivity type. For example, the first conductivity type may be a P-type. However, the inventive concept is not limited thereto. In certain exemplary embodiments, the first conductivity type may be an N-type. Hereinafter, it is not mentioned that the first conductivity type is not limited to the P-type. The substrate 100 may include a first surface 100a and a second surface 100b opposite to each other. In some exemplary embodiments, the second surface 100b of the substrate 100 may be a surface on which light is incident. In other words, light outside an image sensor may be provided into the image sensor through the second surface 100b of the substrate 100.

The photoelectric conversion part 110 may include a first dopant region 112 and a second dopant region 114. The first dopant region 112 may be adjacent directly to the first surface 100a of the substrate 100. The first dopant region 112 may include dopants of the first conductivity type. For example, the first conductivity type may be a P-type.

The second dopant region 114 may be provided on the first dopant region 112. The second dopant region 114 may include dopants of a second conductivity type different from the first conductivity type. For example, the second conductivity type may be an N-type. However, the inventive concept is not limited thereto. In certain exemplary embodiments, the second conductivity type may be a P-type. Hereinafter, it is not mentioned that the second conductivity type is not limited to the N-type. The first and second dopant regions 112 and 114 may form a PN junction diode. In addition, the second dopant region 114 may be in contact with a portion of the substrate 100 disposed between the second dopant region 114 and the second surface 100b of the substrate 100 to form a PN junction diode. Thus, the photoelectric conversion part 110 may receive light to generate charges.

Even though not shown in the drawings, the transistors $T_x$, $S_x$, $A_x$ and $R_x$ of FIG. 1 may be disposed on the first surface 100a of the substrate 100 to sense and transfer the charges generated from the photoelectric conversion part 110.

A device isolation layer 120 may be provided in the substrate 100 to cover a sidewall of the photoelectric conversion part 110. The device isolation layer 120 may surround the photoelectric conversion part 110 when viewed in a plan view. The device isolation layer 120 may define a pixel region. For example, a portion of the substrate 100, which is surrounded by the device isolation layer 120, may be defined as the pixel region. The device isolation layer 120 may include an insulating material. For example, the device isolation layer 120 may include silicon oxide.

A fixed charge layer 200 may be provided on the second surface 100b of the substrate 100. The fixed charge layer 200 may cover the substrate 100 and the device isolation layer 120. The fixed charge layer 200 may include a first metal oxide and a second metal oxide which are different from each other. An electronegativity of a first metal contained in the first metal oxide may be lower than an electronegativity of a second metal contained in the second metal oxide. Generally, a probability of generation of interstitial oxygen in a metal oxide may increase as an electronegativity of a metal contained in the metal oxide decreases. Thus, interstitial oxygen may be more easily generated in the first metal oxide than in the second metal oxide. As a result, an oxygen vacancy may more easily occur in the second metal oxide than in the first metal oxide. In some exemplary embodiments, the first metal oxide may be aluminum oxide (e.g., $Al_2O_3$), and the second metal oxide may be tantalum oxide (e.g., $Ta_2O_5$) or titanium oxide (e.g., $TiO_2$).

Concentration of each of the first and second metal oxides may be non-uniform in the fixed charge layer 200. For example, the concentration of the first metal oxide may progressively increase from an upper portion to a lower portion of the fixed charge layer 200. In other words, concentration of the first metal may progressively increase from the upper portion to the lower portion of the fixed charge layer 200. The concentration of the first metal oxide may have the maximum value in a region adjacent directly to a bottom surface of the fixed charge layer 200. The concentration of the first metal oxide may have the minimum value in a region adjacent directly to a top surface of the fixed charge layer 200.

For example, the concentration of the second metal oxide may progressively increase from the lower portion to the upper portion of the fixed charge layer 200. In other words, concentration of the second metal may progressively increase from the lower portion to the upper portion of the fixed charge layer 200. The concentration of the second metal oxide may have the maximum value in the region adjacent directly to the top surface of the fixed charge layer 200. The concentration of the second metal oxide may have the minimum value in the region adjacent directly to the bottom surface of the fixed charge layer 200.

In some exemplary embodiments, the first metal oxide may be more than the second metal oxide in the lower portion of the fixed charge layer 200. In other words, the concentration of the first metal oxide may be greater than the concentration of the second metal oxide in the lower portion of the fixed charge layer 200. Thus, the interstitial oxygen may be generated in the lower portion of the fixed charge layer 200. The second metal oxide may be more than the first metal oxide in the upper portion of the fixed charge layer 200. In other words, the concentration of the second metal oxide may be greater than the concentration of the first metal oxide in the upper portion of the fixed charge layer 200. Thus, the oxygen vacancy may occur in the upper portion of the fixed charge layer 200. Since the interstitial oxygen is a negative ion, the lower portion of the fixed charge layer 200 may have negative charges. The negative charges may accumulate holes in an upper portion of the substrate 100.

Generally, a dark current may be generated in the substrate 100 when light is not incident on an image sensor, and thus reliability of the image sensor may be deteriorated. However, the fixed charge layer 200 according to some exemplary embodiments of the inventive concept may accumulate holes in the upper portion of the substrate 100, thereby minimizing or preventing the dark current.

A color filter 300 may be provided on the fixed charge layer 200. In some exemplary embodiments, the color filter 300 may transmit light that has a wavelength corresponding to a red color, a green color, or a blue color. However, the inventive concept is not limited thereto. In other words, the color filter 300 is not limited to the foregoing descriptions. A micro lens 400 may be provided on the color filter 300. The micro lens 400 may concentrate light incident on the micro lens 400 and may provide the concentrated light to the photoelectric conversion part 110. An interlayer insulating layer 10 and interconnection lines 20 may be provided on the first surface 100a of the substrate 100. The interconnection lines 20 may be disposed in the interlayer insulating layer 10. A protective layer 30 may be provided on a bottom surface of the interlayer insulating layer 10. The protective layer 30 may be a passivation layer or a support substrate.

Figure 4:
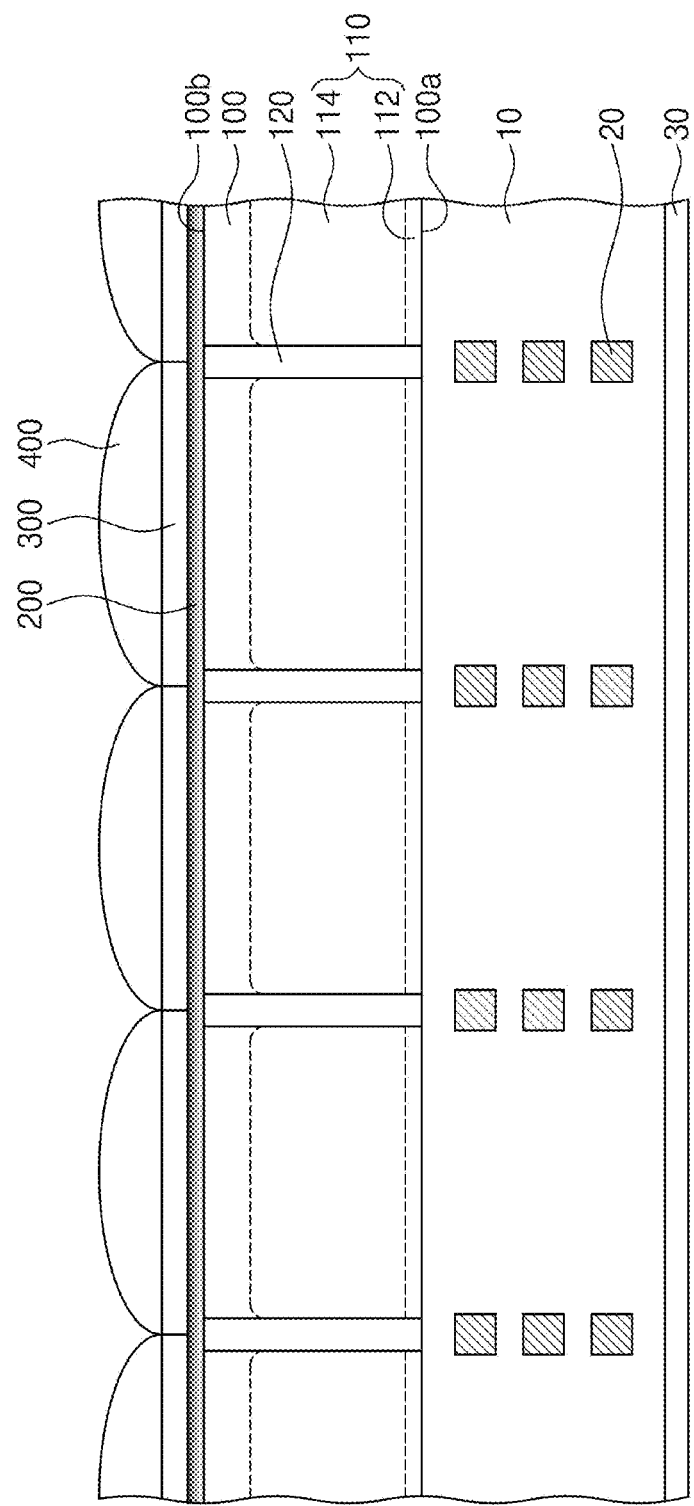
FIG. 4 is a cross-sectional view illustrating an image sensor according to an exemplary embodiment of the inventive concepts.

FIG. 4 is a cross-sectional view illustrating an image sensor according to an exemplary embodiment of the inventive concept. In the present exemplary embodiment, the descriptions to the same elements and technical features as in the embodiments of FIGS. 2 and 3 will be omitted or mentioned briefly for the purpose of ease and convenience in explanation.

Referring to FIG. 4, a substrate 100 may be provided. The substrate 100 may be or include photoelectric conversion parts 110 and a device isolation layer 120. The substrate 100, each of the photoelectric conversion parts 110, and the device isolation layer 120 may be substantially the same as the substrate 100, the photoelectric conversion part 110, and the device isolation layer 120 described with reference to FIG. 2, respectively. The photoelectric conversion parts 110 adjacent directly to each other may be electrically isolated from each other. For example, the directly adjacent photoelectric conversion parts 110 may be spaced apart from each other with the device isolation layer 120 interposed therebetween. The device isolation layer 120 may define a pixel region.

A fixed charge layer 200, color filters 300, and micro lenses 400 may be provided on the second surface 100b of the substrate 100. The fixed charge layer 200 may be substantially the same as the fixed charge layer 200 described with reference to FIGS. 2 and 3. The fixed charge layer 200 may cover the photoelectric conversion parts 110 and the device isolation layer 110.

The color filters 300 may be provided on the fixed charge layer 200. The color filters 300 may be arranged in parallel to the second surface 100b of the substrate 100. In some exemplary embodiments, the color filters 300 may be a Bayer pattern array including red filters, green filters, and blue filters. In certain embodiments, the color filters 300 may be a pattern array including complementary color-based filters (e.g., magenta, green, cyan, and yellow filters). The micro lenses 400 may be provided on the color filters 300. An interlayer insulating layer 10 and interconnection lines 20 may be provided on the first surface 100a of the substrate 100. The interconnection lines 20 may be disposed in the interlayer insulating layer 10.

FIGS. 5 to 8 are cross-sectional views illustrating a method of manufacturing an image sensor according to some exemplary embodiments of the inventive concept.

Figure 5:
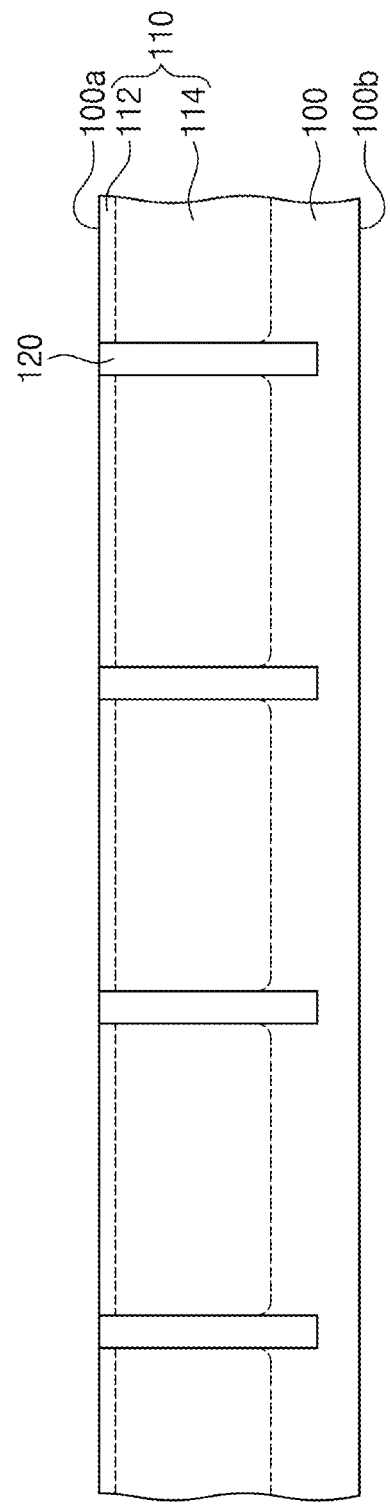
FIGS. 5 to 8 are cross-sectional views illustrating a method of manufacturing an image sensor according to some exemplary embodiments of the inventive concept.

Referring to FIG. 5, a substrate 100 may be prepared. The substrate 100 may include a silicon substrate, a silicon-on-insulator (SOI) substrate, or a semiconductor epitaxial layer. In some exemplary embodiments, the substrate 100 may have a first conductivity type. For example, the first conductivity type may be a P-type. The substrate 100 may have a first surface 100a and a second surface 100b opposite to each other.

A device isolation layer 120 may be formed in the substrate 100. In some exemplary embodiments, the process of forming the device isolation layer 120 may include a process of forming a trench in the substrate 100 by a patterning process using an etch mask (not shown) provided on the first surface 100a of the substrate 100, and a process of filling the trench with an insulating material. For example, the insulating material may include silicon oxide.

Photoelectric conversion parts 110 including first and second dopant regions 112 and 114 may be formed in the substrate 100. In some embodiments, the photoelectric conversion parts 110 may be formed using ion implantation processes. The process of forming the photoelectric conversion parts 110 may include a process of implanting dopant ions of the first conductivity type into the substrate 100 after implanting dopant ions of a second conductivity type into the substrate 100. The second dopant region 114 may be formed using the process of implanting the dopant ions of the second conductivity type into the substrate 100. For example, the second conductivity type may be an N-type. The first dopant region 112 may be formed using the process of implanting the dopant ions of the first conductivity type into the substrate 100. For example, the first conductivity type may be a P-type.

Even though not shown in the drawings, the transfer, source follower, reset, and selection transistors $T_x$, $S_x$, $R_x$, and $A_x$ of FIG. 1 may be formed on the first surface 100a of the substrate 100.

Figure 6:
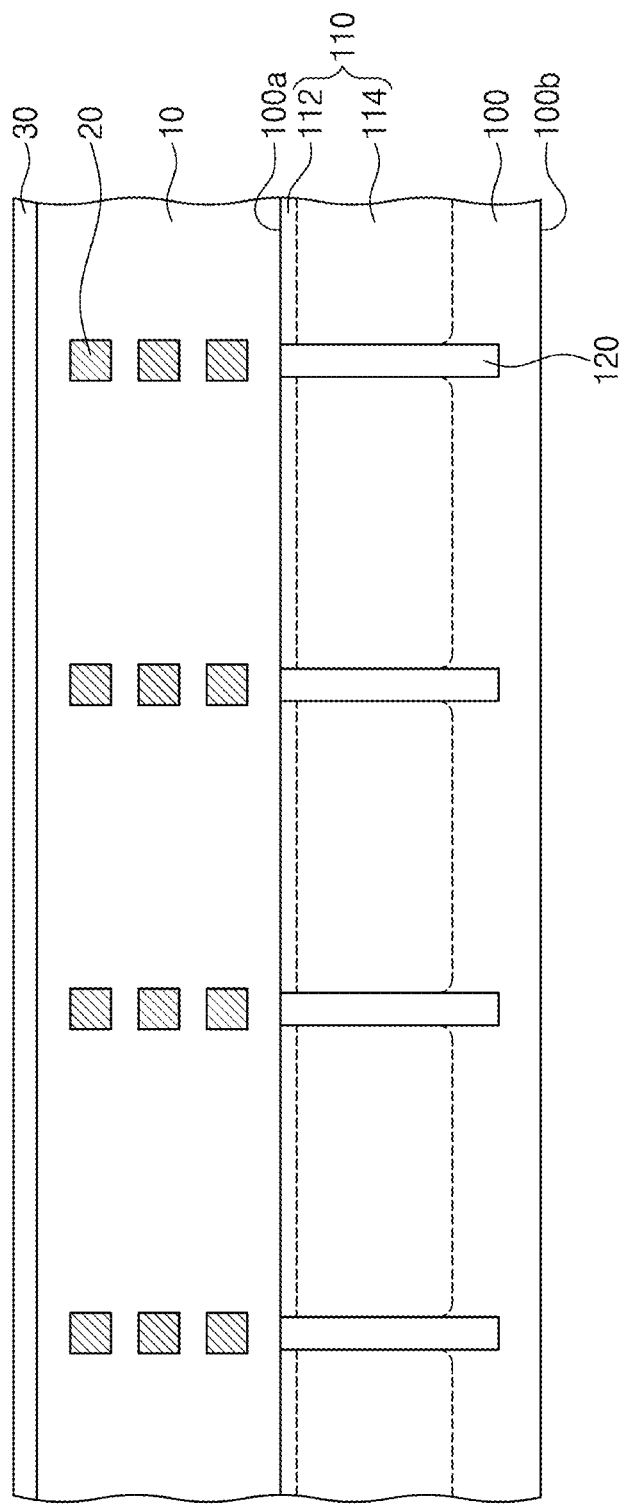

Referring to FIG. 6, an interlayer insulating layer 10, interconnection lines 20, and a protective layer 30 may be formed on the first surface 100a of the substrate 100. In some exemplary embodiments, the interlayer insulating layer 10 may be formed by depositing an insulating material on the first surface 100a of the substrate 100. A conductive material may be deposited on the interlayer insulating layer 10, and the deposited conductive material may be patterned to form the interconnection lines 20. The protective layer 30 may be formed by depositing a passivation material on the interlayer insulating layer 10 and the interconnection lines 20.

Figure 7:
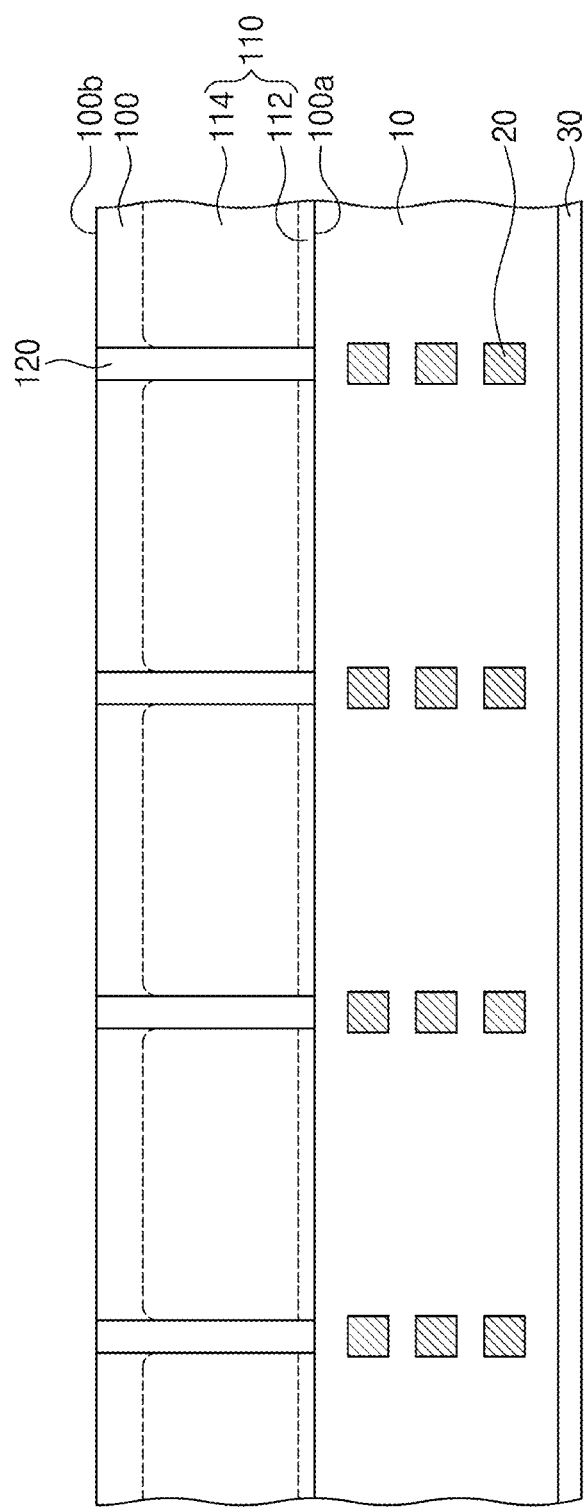

Referring to FIG. 7, a back grinding process may be performed on the second surface 100b of the substrate 100 to remove a portion of the substrate 100. In the back grinding process, the portion of the substrate 100 may be ground to be removed. Unlike FIGS. 5 and 6, the second surface 100b of the substrate 100 faces upward in FIG. 7 for the purpose of ease and convenience in explanation. In some exemplary embodiments, the back grinding process may be performed until the device isolation layer 120 is exposed.

Figure 8:
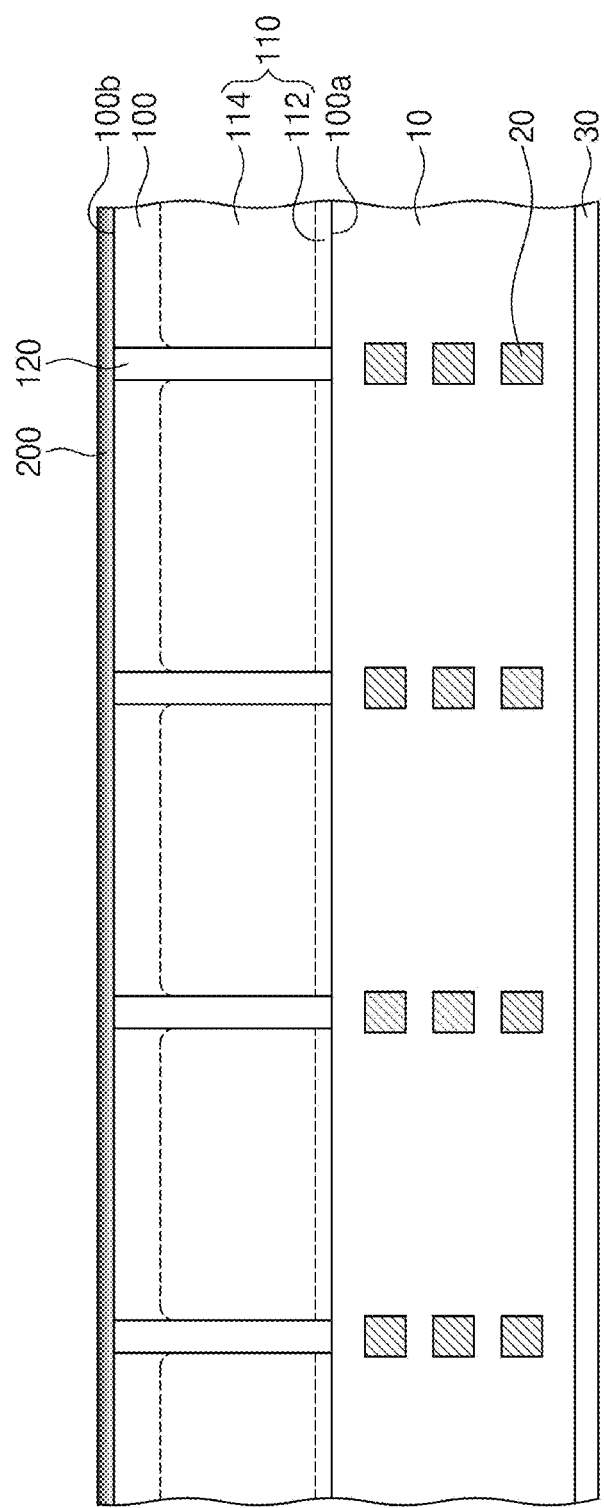

Referring to FIG. 8, a fixed charge layer 200 may be formed on the second surface 100b of the substrate 100. The fixed charge layer 200 may include a first metal oxide and a second metal oxide which are different from each other. Interstitial oxygen may be more easily generated in the first metal oxide than in the second metal oxide. As a result, an oxygen vacancy may more easily occur in the second metal oxide than in the first metal oxide. In some exemplary embodiments, the first metal oxide may be or include aluminum oxide (e.g., $Al_2O_3$), and the second metal oxide may be or include tantalum oxide (e.g., $Ta_2O_5$) or titanium oxide (e.g., $TiO_2$).

The process of forming the fixed charge layer 200 may include a process of depositing the first and second metal oxides on the second surface 100b of the substrate 100. In some exemplary embodiments, the amount of the first metal oxide supplied to the second surface 100b of the substrate 100 may gradually decrease during the deposition process. Thus, the supply amount of the first metal oxide may be the greatest at the start of the deposition process and may be the smallest at the end of the deposition process. Concentration of the first metal oxide may be greater in a lower portion of the fixed charge layer 200 than in an upper portion of the fixed charge layer 200. In some exemplary embodiments, the amount of the second metal oxide supplied to the second surface 100b of the substrate 100 may gradually increase during the deposition process. Thus, the supply amount of the second metal oxide may be the smallest at the start of the deposition process and may be the greatest at the end of the deposition process. Concentration of the second metal oxide may be greater in the upper portion of the fixed charge layer 200 than in the lower portion of the fixed charge layer 200. In some exemplary embodiments, the first metal oxide may be more than the second metal oxide in the lower portion of the fixed charge layer 200, and the second metal oxide may be more than the first metal oxide in the upper portion of the fixed charge layer 200.

Referring again to FIGS. 2 and 4, color filters 300 and micro lenses 400 may be formed on the fixed charge layer 200.

Figure 9:
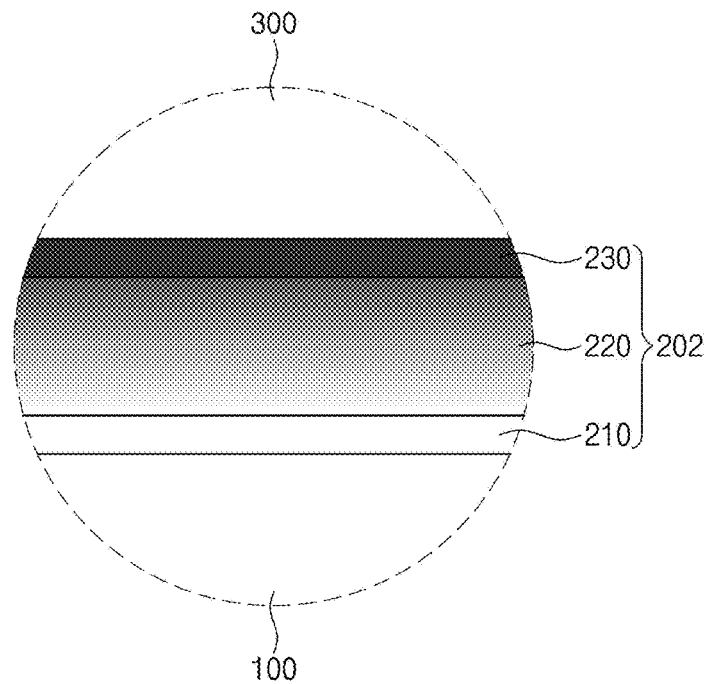
FIG. 9 is an enlarged view corresponding to the portion 'AA' of FIG. 2 to illustrate an image sensor according to an exemplary embodiment of the inventive concept.

FIG. 9 is an enlarged view corresponding to the portion 'AA' of FIG. 2 to illustrate an image sensor according to an exemplary embodiment of the inventive concept. In the present exemplary embodiment, the descriptions to the same elements and technical features as in the embodiments of FIGS. 2 and 3 will be omitted or mentioned briefly for the purpose of ease and convenience in explanation. Other components of an image sensor of FIG. 9 except a fixed charge layer 202 may be substantially the same as corresponding components of the image sensor described with reference to FIGS. 2 and 3. Hereinafter, the fixed charge layer 202 will be mainly described.

Referring to FIGS. 2 and 9, the fixed charge layer 202 may include a lower layer 210, an intermediate layer 220, and an upper layer 230, which are sequentially stacked. The lower layer 210 may be formed of a first metal oxide. In other words, the lower layer 210 may not include a second metal oxide. The first and second metal oxides may be substantially the same as described with reference to FIGS. 2 and 3. The lower layer 210 may include interstitial oxygen. Since the interstitial oxygen is a negative ion, the lower layer 210 may have negative charges. In some exemplary embodiments, the lower layer 210 may be formed by depositing the first metal oxide on the second surface 100b of the substrate 100.

The intermediate layer 220 may include the first metal oxide and the second metal oxide. The intermediate layer 220 may be substantially the same as the fixed charge layer 200 described with reference to FIGS. 2 and 3. In other words, concentration of the first metal oxide may progressively increase from an upper portion to a lower portion of the intermediate layer 220. On the contrary, concentration of the second metal oxide may progressively increase from the lower portion to the upper portion of the intermediate layer 220. In some exemplary embodiments, the intermediate layer 220 may be formed by depositing the first and second metal oxides on the lower layer 210. As described with reference to FIG. 8, the amount of the first metal oxide supplied onto the lower layer 210 may gradually decrease during the deposition process of the first and second metal oxides. On the contrary, the amount of the second metal oxide supplied onto the lower layer 210 may gradually increase during the deposition process of the first and second metal oxides.

The upper layer 230 may be formed of the second metal oxide. In other words, the upper layer 230 may not include the first metal oxide. In some exemplary embodiments, the upper layer 230 may be formed by depositing the second metal oxide on the intermediate layer 220.

According to some exemplary embodiments of the inventive concept, the negative charges in the lower layer 210 of the fixed charge layer 202 may accumulate holes in an upper portion of the substrate 100. Generation of a dark current may be minimized or prevented by the holes accumulated in the upper portion of the substrate 100.

Figure 10:
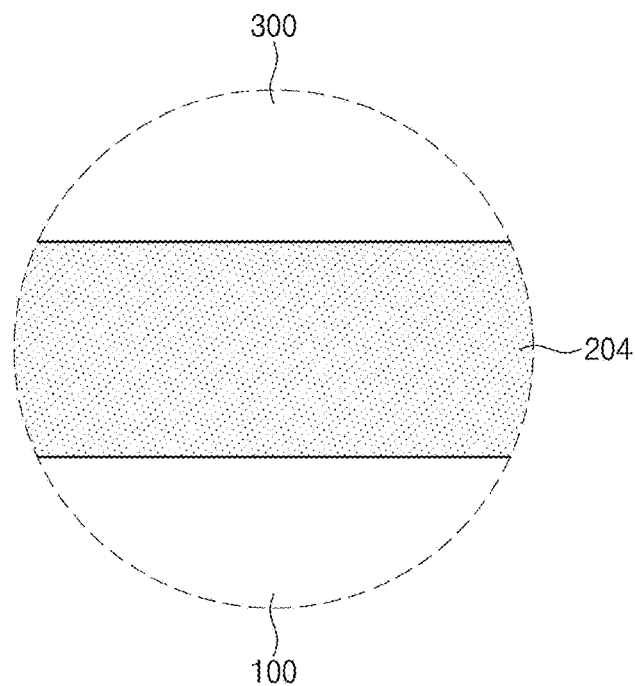
FIG. 10 is an enlarged view corresponding to the portion 'AA' of FIG. 2 to illustrate an image sensor according to an exemplary embodiment of the inventive concept.

FIG. 10 is an enlarged view corresponding to the portion 'AA' of FIG. 2 to illustrate an image sensor according to some embodiments of the inventive concepts. In the present embodiment, the descriptions to the same elements and technical features as in the embodiments of FIGS. 2 and 3 will be omitted or mentioned briefly for the purpose of ease and convenience in explanation. Other components of an image sensor of FIG. 10 except a fixed charge layer 204 may be substantially the same as corresponding components of the image sensor described with reference to FIGS. 2 and 3. Hereinafter, the fixed charge layer 204 will be mainly described.

Referring to FIGS. 2 and 10, the fixed charge layer 204 may be formed of a first metal oxide doped with impurities. The first metal oxide may be substantially the same as described with reference to FIGS. 2 and 3. The fixed charge layer 204 may include the impurities for accelerating generation of interstitial oxygen in the first metal oxide. For example, the impurities may include tantalum (Ta) or nitrogen (N). The impurities may be uniformly distributed in the fixed charge layer 204. In some exemplary embodiments, doping concentration of the impurities may be greater than 0% and equal to or less than 1%. Since the interstitial oxygen is a negative ion, the fixed charge layer 204 may have negative charges. In some exemplary embodiments, the fixed charge layer 204 may be formed by a process of depositing the first metal oxide on the second surface 100b of the substrate 100 and a process of supplying the impurities during the depositing process.

According to some exemplary embodiments of the inventive concept, the negative charges in the fixed charge layer 204 may accumulate holes in an upper portion of the substrate 100. Generation of a dark current may be minimized or prevented by the holes accumulated in the upper portion of the substrate 100.

The image sensor according to the foregoing exemplary embodiments of the inventive concept may include the fixed charge layer. The fixed charge layer may have the negative charges. The negative charges of the fixed charge layer may inhibit or prevent occurrence of the dark current in the substrate to improve the reliability of the image sensor.

While the inventive concept has been described with reference to exemplary embodiments, it will be apparent to those skilled in the art that various changes and modifications may be made without departing from the spirits and scopes of the inventive concept. Therefore, it should be understood that the above exemplary embodiments are not limiting, but illustrative. Thus, the scope of the inventive concept is to be determined by the broadest permissible interpretation of the following claims and their equivalents, and shall not be restricted or limited by the foregoing descriptions.

What is claimed is:

1. An image sensor comprising:
a substrate comprising a photoelectric conversion part therein; and
a fixed charge layer provided above the substrate,
wherein the fixed charge layer comprises a first metal oxide and a second metal oxide, which are different from each other,
wherein the first metal oxide comprises a first metal,
wherein the second metal oxide comprises a second metal different from the first metal, and
wherein concentration of the first metal in the fixed charge layer gradually increases from a top surface of the fixed charge layer toward a bottom surface of the fixed charge layer.

2. The image sensor of claim 1, wherein the fixed charge layer is configured to such that interstitial oxygen is more easily generated in the first metal oxide than in the second metal oxide.

3. The image sensor of claim 2, wherein the first metal oxide comprises $Al_2O_3$, and the second metal oxide comprises at least one of $Ta_2O_5$ and $TiO_2$.

4. The image sensor of claim 1, wherein concentration of the first metal oxide is greater than concentration of the second metal oxide in the lower portion of the fixed charge layer.

5. The image sensor of claim 1, wherein concentration of the second metal in the fixed charge layer gradually increases from the bottom surface of the fixed charge layer toward the top surface of the fixed charge layer.

6. The image sensor of claim 1, further comprising:
a lower layer provided between the fixed charge layer and the substrate; and
an upper layer spaced apart from the lower layer with the fixed charge layer interposed therebetween,
wherein the lower layer includes the first metal oxide, and
wherein the upper layer includes the second metal oxide.

7. The image sensor of claim 6, wherein concentration of the first metal in the lower layer is greater than concentration of the first metal in a lower portion of the fixed charge layer, and
wherein concentration of the second metal in the upper layer is greater than concentration of the second metal in an upper portion of the fixed charge layer.

8. The image sensor of claim 1, wherein concentration of the second metal oxide is greater than concentration of the first metal oxide in an upper portion of the fixed charge layer.

9. The image sensor of claim 1, wherein a plurality of photoelectric conversion parts comprising the photoelectric conversion part are provided in the substrate, wherein the plurality of photoelectric conversion parts are arranged in parallel to a top surface of the substrate, wherein the fixed charge layer covers top surfaces of the plurality of photoelectric conversion parts and the top surface of the substrate, and wherein light is incident into the substrate through the top surface of the substrate.

10. The image sensor of claim 9, further comprising:
a device isolation layer disposed in the substrate to separate the photoelectric conversion parts from each other, wherein the fixed charge layer covers a top surface of the device isolation layer.

11. An image sensor comprising:
a substrate comprising a photoelectric conversion part therein; and
a fixed charge layer provided above the substrate,
wherein the fixed charge layer comprises a metal oxide doped with impurities,
wherein the impurities are configured to accelerate generation of interstitial oxygen in the metal oxide, and
wherein the impurities are uniformly distributed throughout the fixed charge layer.

12. The image sensor of claim 11, wherein doping concentration of the impurities is greater than 0% and equal to or less than 1%.

13. The image sensor of claim 11, wherein the metal oxide comprises $Al_2O_3$.

14. The image sensor of claim 11, wherein the impurities comprise tantalum (Ta) or nitrogen (N).

15. An image sensor comprising:
a substrate comprising a photoelectric conversion part; and
a fixed charge layer disposed above the substrate and comprising a metal oxide doped with impurities to form negative charges,
wherein the impurities are uniformly distributed throughout the fixed charge layer,
wherein the metal oxide comprises Al2O3, and
wherein the impurities comprise tantalum (Ta) or nitrogen (N).

16. The image sensor of claim 15, wherein the fixed charge layer is configured such that concentration of the negative charges is greater in a lower portion of the fixed charge layer close to the substrate than in an upper portion of the fixed charge layer opposite to the lower portion.

17. The image sensor of claim 15, wherein the fixed charge layer comprises the impurities of which concentration is greater than 0% and equal to or less than 1%.

18. The image sensor of claim 15, wherein the fixed charge layer comprises a plurality of different metal oxides, and is configured to generate interstitial oxygen more easily in a lower portion of the fixed charge layer than in an upper portion of the fixed charge layer.

* * * * *